United States Patent
Wang et al.

(10) Patent No.: US 11,494,629 B2
(45) Date of Patent: Nov. 8, 2022

(54) CHARGE-SHARING COMPUTE-IN-MEMORY SYSTEM

(71) Applicant: QUALCOMM Incorporated, San Diego, CA (US)

(72) Inventors: Zhongze Wang, San Diego, CA (US); Xia Li, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 614 days.

(21) Appl. No.: 16/669,855

(22) Filed: Oct. 31, 2019

(65) Prior Publication Data

US 2021/0133549 A1     May 6, 2021

(51) Int. Cl.
| | |
|---|---|
| G11C 16/08 | (2006.01) |
| G06N 3/063 | (2006.01) |
| G11C 11/419 | (2006.01) |
| G11C 11/412 | (2006.01) |
| G11C 11/21 | (2006.01) |

(52) U.S. Cl.
CPC .......... *G06N 3/0635* (2013.01); *G06N 3/063* (2013.01); *G11C 11/21* (2013.01); *G11C 11/412* (2013.01); *G11C 11/419* (2013.01)

(58) Field of Classification Search
CPC .... G06N 3/0635; G06N 3/063; G06N 3/0454; G11C 11/21; G11C 11/412; G11C 11/419; G11C 7/16; G11C 7/1006; G11C 11/54
See application file for complete search history.

(56) References Cited

U.S. PATENT DOCUMENTS

| | | | | |
|---|---|---|---|---|
| 10,777,259 | B1 * | 9/2020 | Wang | ........................ G11C 11/54 |
| 2012/0206986 | A1 * | 8/2012 | Wang | ..................... G11C 11/419 |
| | | | | 365/210.1 |
| 2012/0230086 | A1 * | 9/2012 | Chiu | ....................... G11C 11/412 |
| | | | | 365/154 |
| 2019/0042199 | A1 * | 2/2019 | Sumbul | ................. G11C 11/404 |
| 2019/0042928 | A1 * | 2/2019 | Young | .................. H03M 7/6011 |
| 2020/0012924 | A1 * | 1/2020 | Ma | .......................... G06N 5/046 |

\* cited by examiner

*Primary Examiner* — Hien N Nguyen
(74) *Attorney, Agent, or Firm* — Patterson+ Sheridan, L.L.P.

(57) ABSTRACT

Certain aspects provide a circuit for in-memory computation. The circuit generally includes a first memory cell, and a first computation circuit. The first computation circuit may include a first switch having a control input coupled to an output of the first memory cell, a second switch coupled between a node of the first computation circuit and the first switch, a control input of the second switch being coupled to a discharge word-line (DCWL), a capacitive element coupled between the node and a reference potential node, a third switch coupled between the node and a read bit-line (RBL), and a fourth switch coupled between the node and an activation (ACT) line.

20 Claims, 13 Drawing Sheets

US 11,494,629 B2

CHARGE-SHARING COMPUTE-IN-MEMORY SYSTEM

FIELD OF THE DISCLOSURE

The present disclosure generally relates to artificial neural networks and, more particularly, to techniques and apparatus for performing in-memory computations.

DESCRIPTION OF RELATED ART

An artificial neural network, which may be composed of an interconnected group of artificial neurons (e.g., neuron models), is a computational device or represents a method performed by a computational device. These neural networks may be used for various applications and/or devices, such as Internet Protocol (IP) cameras, Internet of Things (IoT) devices, autonomous vehicles, and/or service robots.

Convolutional neural networks (CNNs) are a type of feed-forward artificial neural network. Convolutional neural networks may include collections of artificial neurons that each have a receptive field and that collectively tile an input space. Convolutional neural networks have numerous applications. In particular, CNNs have broadly been used in the area of pattern recognition and classification.

In layered neural network architectures, the output of a first layer of artificial neurons becomes an input to a second layer of artificial neurons, the output of a second layer of artificial neurons becomes an input to a third layer of artificial neurons, and so on. Convolutional neural networks may be trained to recognize a hierarchy of features. Computation in convolutional neural network architectures may be distributed over a population of processing nodes, which may be configured in one or more computational chains. These multi-layered architectures may be trained one layer at a time and may be fine-tuned using back propagation.

SUMMARY

Certain aspects of the present disclosure are directed to methods and apparatus for in-memory computation.

Certain aspects provide a circuit for in-memory computation. The circuit generally includes a first memory cell and a first computation circuit. The first computation circuit may include a first switch having a control input coupled to an output of the first memory cell, a second switch coupled between a node of the first computation circuit and the first switch, a control input of the second switch being coupled to a discharge word-line (DCWL), a capacitive element coupled between the node and a reference potential node, a third switch coupled between the node and a read bit-line (RBL), and a fourth switch coupled between the node and an activation (ACT) line.

Certain aspects provide a method for in-memory computation. The method generally includes storing a first bit of a first computation parameter in a first memory cell; generating, on an ACT line, an analog signal representing a second computation parameter; coupling, via a first switch, the ACT line to a first capacitive element during a charge cycle; selectively coupling, via a second switch, the capacitive element to a reference potential node based on the first bit of the first computation parameter; and coupling, via a third switch, the capacitive element to a first RBL during a read cycle.

Other aspects, advantages, and features of the present disclosure will become apparent after review of the entire application, including the following sections: Brief Description of the Drawings, Detailed Description, and the Claims.

DETAILED DESCRIPTION

Certain aspects of the present disclosure provide methods and apparatus for in-memory computations.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Example Artificial Neural Networks

Figure 1:
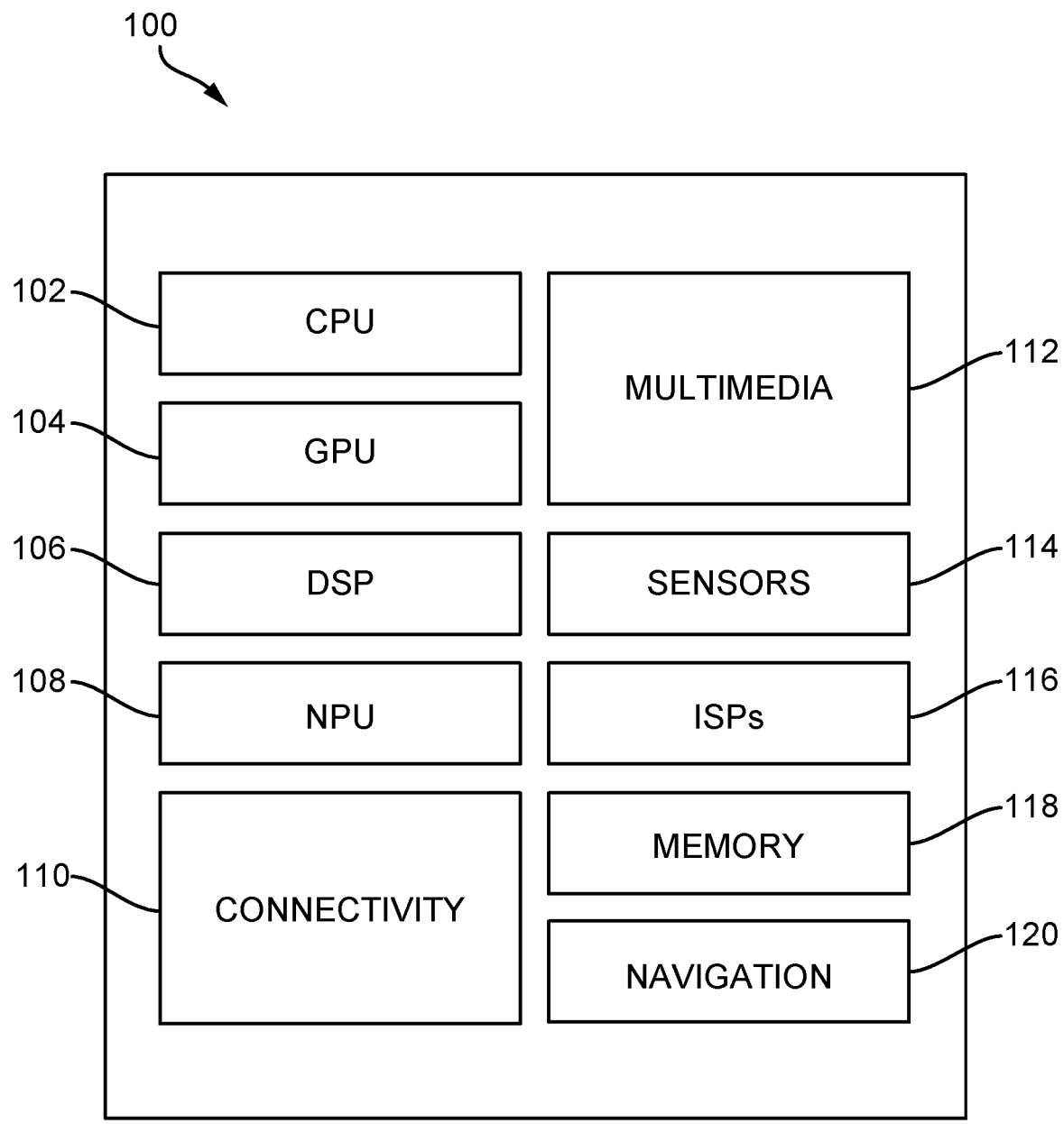
FIG. 1 illustrates an example implementation of a system-on-a-chip (SOC).

FIG. 1 illustrates an example implementation of a system-on-a-chip (SOC) 100, which may include a central processing unit (CPU) 102 or a multi-core CPU configured to perform a parallel Monte Carlo dropout function, in accordance with certain aspects of the present disclosure. Variables (e.g., neural signals and synaptic weights), system parameters associated with a computational device (e.g., neural network with weights), delays, frequency bin information, and task information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a memory block 118, or may be distributed across multiple blocks. In certain aspects, weights may be stored in a static random-access memory (SRAM) configured to in-memory computations, as described in more detail herein. Instructions executed at the CPU 102 may be loaded from a program memory associated with the CPU 102 or may be loaded from a memory block 118.

The SOC 100 may also include additional processing blocks tailored to specific functions, such as a GPU 104, a DSP 106, a connectivity block 110, which may include fifth generation (5G) connectivity, fourth generation long term evolution (4G LTE) connectivity, Wi-Fi connectivity, USB connectivity, Bluetooth connectivity, and the like, and a multimedia processor 112 that may, for example, detect and recognize gestures. In one implementation, the NPU is implemented in the CPU, DSP, and/or GPU. The SOC 100 may also include a sensor processor 114, image signal processors (ISPs) 116, and/or navigation module 120, which may include a global positioning system.

The SOC 100 may be based on an ARM instruction set. In an aspect of the present disclosure, the instructions loaded into the CPU 102 may comprise code to search for a stored multiplication result in a lookup table (LUT) corresponding to a multiplication product of an input feature value and a filter weight. The instructions loaded into the CPU 102 may also comprise code to disable a multiplier during a multiplication operation of the multiplication product when a lookup table hit of the multiplication product is detected. In addition, the instructions loaded into the CPU 102 may comprise code to store a computed multiplication product of the input feature and the filter weight when a lookup table miss of the multiplication product is detected.

SOC 100 and/or components thereof may be configured to perform video compression and/or decompression according to aspects of the present disclosure discussed below. By using deep learning architectures to perform video compression and/or decompression, aspects of the present disclosure may accelerate the compression of video content on a device and transmission of the compressed video to another device and/or may accelerate the decompression of compressed video content received at the device.

Deep learning architectures may perform an object recognition task by learning to represent inputs at successively higher levels of abstraction in each layer, thereby building up a useful feature representation of the input data. In this way, deep learning addresses a major bottleneck of traditional machine learning. Prior to the advent of deep learning, a machine learning approach to an object recognition problem may have relied heavily on human engineered features, perhaps in combination with a shallow classifier. A shallow classifier may be a two-class linear classifier, for example, in which a weighted sum of the feature vector components may be compared with a threshold to predict to which class the input belongs. Human engineered features may be templates or kernels tailored to a specific problem domain by engineers with domain expertise. Deep learning architectures, in contrast, may learn to represent features that are similar to what a human engineer might design, but through training. Furthermore, a deep network may learn to represent and recognize new types of features that a human might not have considered.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases.

Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers. A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Figure 2A:
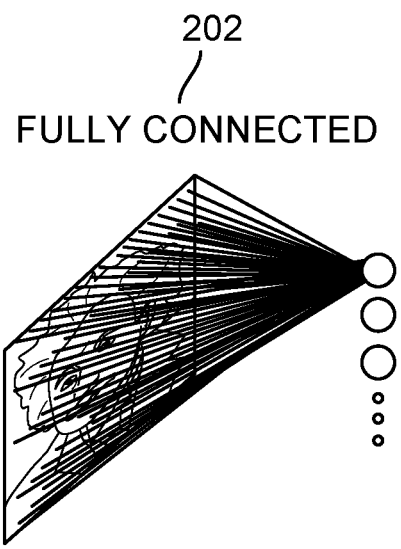
FIG. 2A illustrates an example of a fully connected neural network.
Figure 2B:
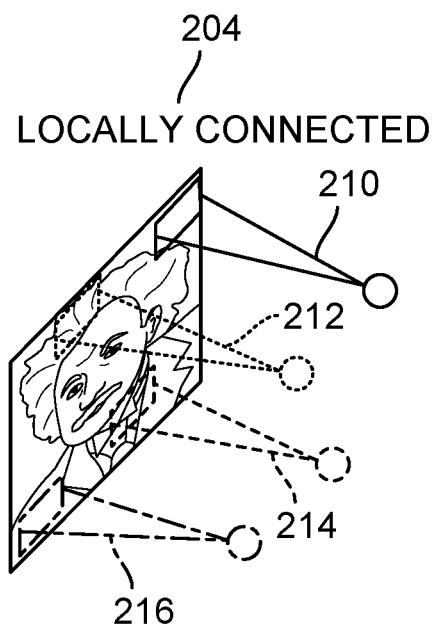
FIG. 2B illustrates an example of a locally connected neural network.

The connections between layers of a neural network may be fully connected or locally connected. FIG. 2A illustrates an example of a fully connected neural network 202. In a fully connected neural network 202, a neuron in a first layer may communicate its output to every neuron in a second layer, so that each neuron in the second layer will receive input from every neuron in the first layer. FIG. 2B illustrates an example of a locally connected neural network 204. In a locally connected neural network 204, a neuron in a first layer may be connected to a limited number of neurons in the second layer. More generally, a locally connected layer of the locally connected neural network 204 may be configured so that each neuron in a layer will have the same or a similar connectivity pattern, but with connections strengths that may have different values (e.g., 210, 212, 214, and 216). The locally connected connectivity pattern may give rise to spatially distinct receptive fields in a higher layer, because the higher layer neurons in a given region may receive inputs that are tuned through training to the properties of a restricted portion of the total input to the network.

Figure 2C:
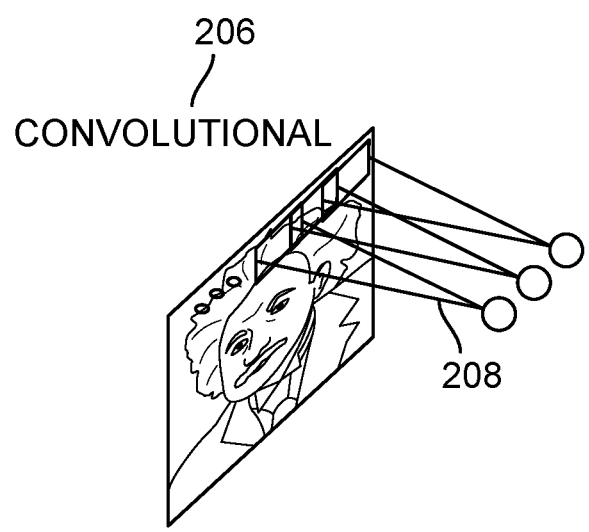
FIG. 2C illustrates an example of a convolutional neural network.

One example of a locally connected neural network is a convolutional neural network. FIG. 2C illustrates an example of a convolutional neural network 206. The convolutional neural network 206 may be configured such that the connection strengths associated with the inputs for each neuron in the second layer are shared (e.g., 208). Convolutional neural networks may be well suited to problems in which the spatial location of inputs is meaningful. Convolutional neural network 206 may be used to perform one or more aspects of video compression and/or decompression, according to aspects of the present disclosure.

Figure 2D:
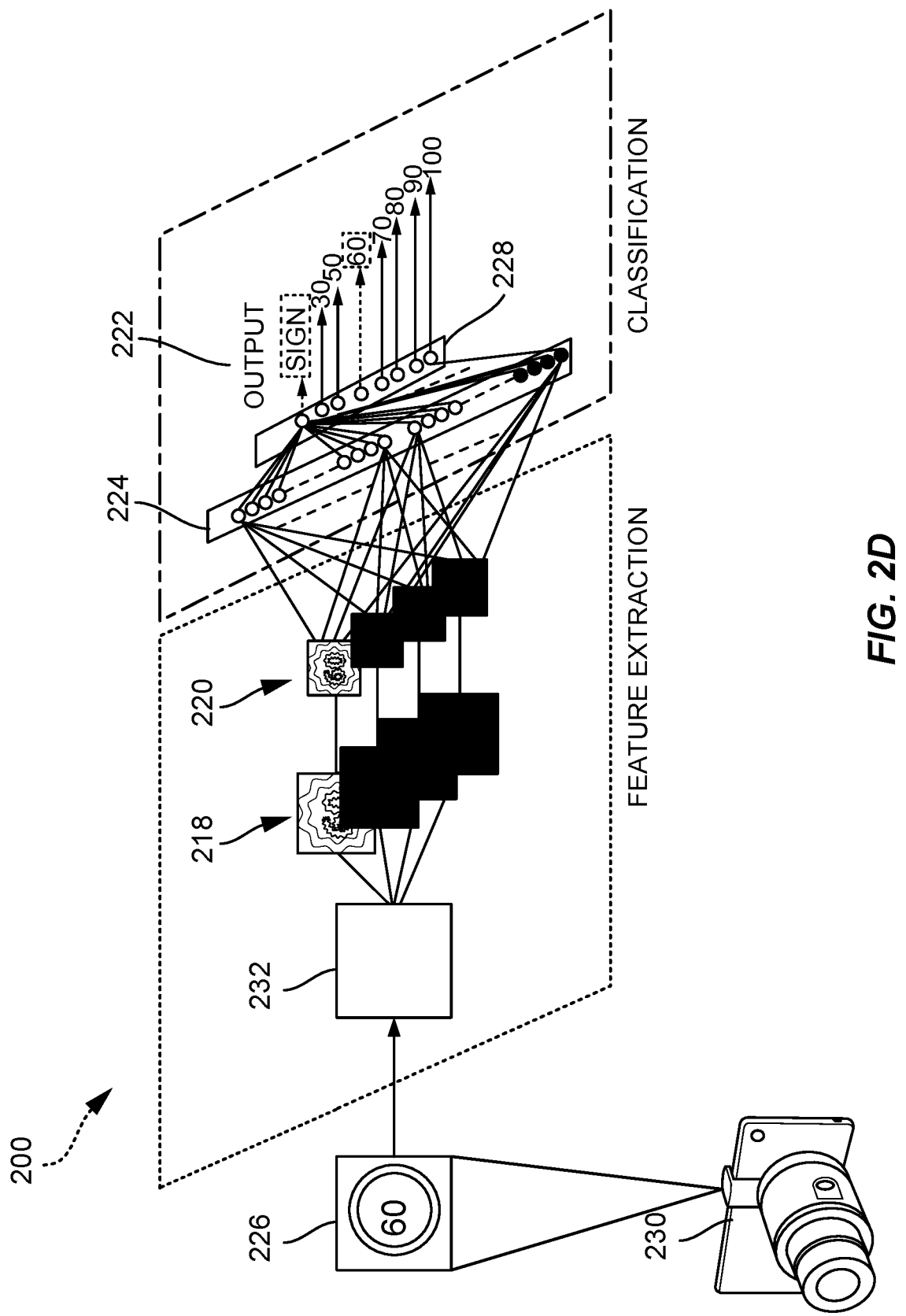
FIG. 2D illustrates a detailed example of a deep convolutional network (DCN) designed to recognize visual features from an image.

One type of convolutional neural network is a deep convolutional network (DCN). FIG. 2D illustrates a detailed example of a DCN 200 designed to recognize visual features from an image 226 input from an image capturing device 230, such as a car-mounted camera. The DCN 200 of the current example may be trained to identify traffic signs and a number provided on the traffic sign. Of course, the DCN 200 may be trained for other tasks, such as identifying lane markings or identifying traffic lights.

The DCN 200 may be trained with supervised learning. During training, the DCN 200 may be presented with an image, such as the image 226 of a speed limit sign, and a forward pass may then be computed to produce an output 222. The DCN 200 may include a feature extraction section and a classification section. Upon receiving the image 226, a convolutional layer 232 may apply convolutional kernels (not shown) to the image 226 to generate a first set of feature maps 218. As an example, the convolutional kernel for the convolutional layer 232 may be a 5×5 kernel that generates 28×28 feature maps. In the present example, because four different feature maps are generated in the first set of feature maps 218, four different convolutional kernels were applied to the image 226 at the convolutional layer 232. The convolutional kernels may also be referred to as filters or convolutional filters.

The first set of feature maps 218 may be subsampled by a max pooling layer (not shown) to generate a second set of feature maps 220. The max pooling layer reduces the size of the first set of feature maps 218. That is, a size of the second set of feature maps 220, such as 14×14, is less than the size of the first set of feature maps 218, such as 28×28. The reduced size provides similar information to a subsequent layer while reducing memory consumption. The second set of feature maps 220 may be further convolved via one or more subsequent convolutional layers (not shown) to generate one or more subsequent sets of feature maps (not shown).

In the example of FIG. 2D, the second set of feature maps 220 is convolved to generate a first feature vector 224. Furthermore, the first feature vector 224 is further convolved to generate a second feature vector 228. Each feature of the second feature vector 228 may include a number that corresponds to a possible feature of the image 226, such as "sign," "60," and "100." A softmax function (not shown) may convert the numbers in the second feature vector 228 to a probability. As such, an output 222 of the DCN 200 is a probability of the image 226 including one or more features.

In the present example, the probabilities in the output 222 for "sign" and "60" are higher than the probabilities of the others of the output 222, such as "30," "40," "50," "70," "80," "90," and "100." Before training, the output 222 produced by the DCN 200 is likely to be incorrect. Thus, an error may be calculated between the output 222 and a target output. The target output is the ground truth of the image 226 (e.g., "sign" and "60"). The weights of the DCN 200 may then be adjusted so the output 222 of the DCN 200 is more closely aligned with the target output. In certain aspects, the weights of the DCN 200 may be stored in an SRAM configured for in-memory computations, as described in more detail herein.

To adjust the weights, a learning algorithm may compute a gradient vector for the weights. The gradient may indicate an amount that an error would increase or decrease if the weight were adjusted. At the top layer, the gradient may correspond directly to the value of a weight connecting an activated neuron in the penultimate layer and a neuron in the output layer. In lower layers, the gradient may depend on the value of the weights and on the computed error gradients of the higher layers. The weights may then be adjusted to reduce the error. This manner of adjusting the weights may be referred to as "back propagation" as it involves a "backward pass" through the neural network.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level. After learning, the DCN may be presented with new images (e.g., the speed limit sign of the image 226) and a forward pass through the network may yield an output 222 that may be considered an inference or a prediction of the DCN.

Deep belief networks (DBNs) are probabilistic models comprising multiple layers of hidden nodes. DBNs may be used to extract a hierarchical representation of training data sets. A DBN may be obtained by stacking up layers of Restricted Boltzmann Machines (RBMs). An RBM is a type of artificial neural network that can learn a probability distribution over a set of inputs. Because RBMs can learn a probability distribution in the absence of information about the class to which each input should be categorized, RBMs are often used in unsupervised learning. Using a hybrid unsupervised and supervised paradigm, the bottom RBMs of a DBN may be trained in an unsupervised manner and may serve as feature extractors, and the top RBM may be trained in a supervised manner (on a joint distribution of inputs from the previous layer and target classes) and may serve as a classifier.

Deep convolutional networks (DCNs) are networks of convolutional networks, configured with additional pooling and normalization layers. DCNs have achieved state-of-the-art performance on many tasks. DCNs can be trained using supervised learning in which both the input and output targets are known for many exemplars and are used to modify the weights of the network by use of gradient descent methods.

DCNs may be feed-forward networks. In addition, as described above, the connections from a neuron in a first layer of a DCN to a group of neurons in the next higher layer are shared across the neurons in the first layer. The feed-forward and shared connections of DCNs may be exploited for fast processing. The computational burden of a DCN may be much less, for example, than that of a similarly sized neural network that comprises recurrent or feedback connections.

The processing of each layer of a convolutional network may be considered a spatially invariant template or basis projection. If the input is first decomposed into multiple channels, such as the red, green, and blue channels of a color image, then the convolutional network trained on that input may be considered three-dimensional, with two spatial dimensions along the axes of the image and a third dimension capturing color information. The outputs of the convolutional connections may be considered to form a feature map in the subsequent layer, with each element of the feature map (e.g., 220) receiving input from a range of neurons in the previous layer (e.g., feature maps 218) and from each of the multiple channels. The values in the feature map may be further processed with a non-linearity, such as a rectification, max(0,x). Values from adjacent neurons may be further pooled, which corresponds to down sampling, and may provide additional local invariance and dimensionality reduction. Normalization, which corresponds to whitening, may also be applied through lateral inhibition between neurons in the feature map.

The performance of deep learning architectures may increase as more labeled data points become available or as computational power increases. Modern deep neural networks are routinely trained with computing resources that are thousands of times greater than what was available to a typical researcher just fifteen years ago. New architectures and training paradigms may further boost the performance of deep learning. Rectified linear units may reduce a training issue known as vanishing gradients. New training techniques may reduce over-fitting and thus enable larger models to achieve better generalization. Encapsulation techniques may abstract data in a given receptive field and further boost overall performance.

Figure 3:
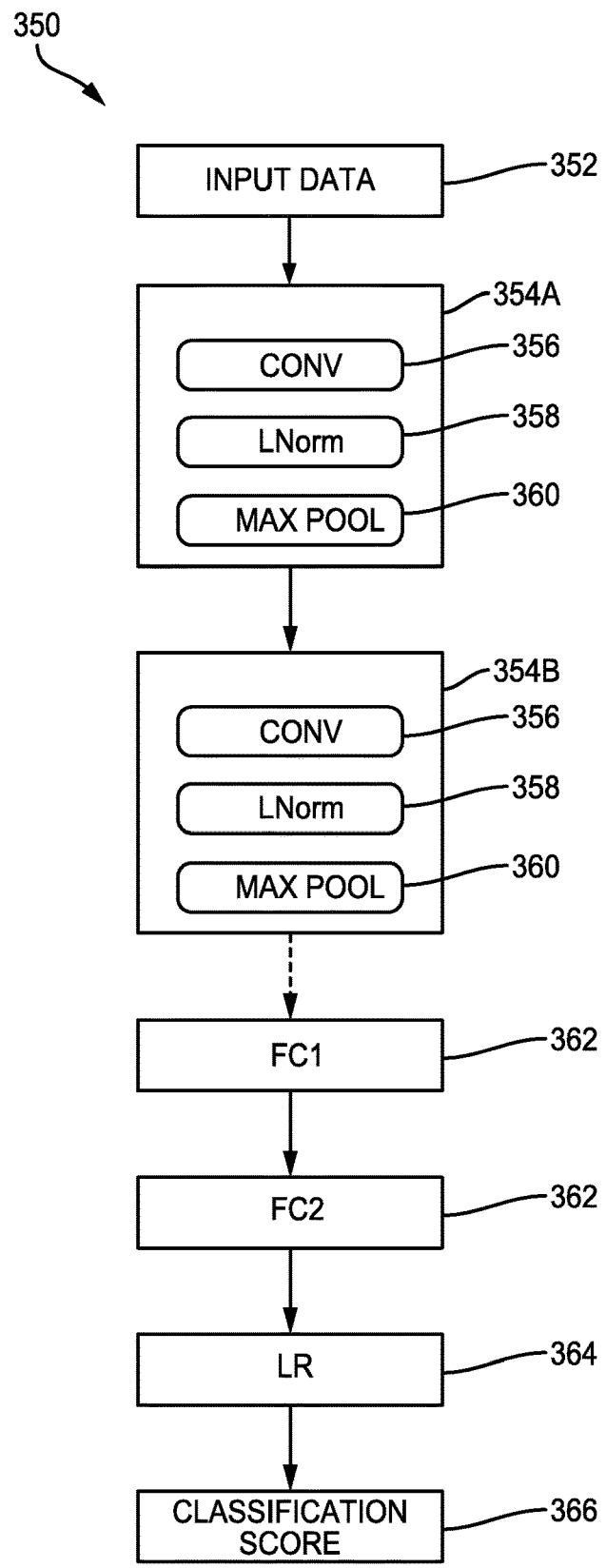
FIG. 3 is a block diagram illustrating a DCN.

FIG. 3 is a block diagram illustrating a deep convolutional network 350. The deep convolutional network 350 may include multiple different types of layers based on connectivity and weight sharing. As shown in FIG. 3E, the deep convolutional network 350 includes the convolution blocks 354A, 354B. Each of the convolution blocks 354A, 354B may be configured with a convolution layer (CONV) 356, a normalization layer (LNorm) 358, and a max pooling layer (MAX POOL) 360. Deep convolutional network 350 may be used to perform video compression and/or decompression, according to aspects of the present disclosure.

The convolution layers 356 may include one or more convolutional filters, which may be applied to the input data to generate a feature map. Although only two of the convolution blocks 354A, 354B are shown, the present disclosure is not so limiting, and instead, any number of the convolution blocks 354A, 354B may be included in the deep convolutional network 350 according to design preference. The normalization layer 358 may normalize the output of the convolution filters. For example, the normalization layer 358 may provide whitening or lateral inhibition. The max pooling layer 360 may provide down sampling aggregation over space for local invariance and dimensionality reduction.

The parallel filter banks, for example, of a deep convolutional network may be loaded on a CPU 102 or GPU 104 of an SOC 100 to achieve high performance and low power consumption. In alternative aspects, the parallel filter banks may be loaded on the DSP 106 or an ISP 116 of an SOC 100. In addition, the deep convolutional network 350 may access other processing blocks that may be present on the SOC 100, such as sensor processor 114 and navigation module 120, dedicated, respectively, to sensors and navigation.

The deep convolutional network 350 may also include one or more fully connected layers 362 (FC1 and FC2). The deep convolutional network 350 may further include a logistic regression (LR) layer 364. Between each layer 356, 358, 360, 362, 364 of the deep convolutional network 350 are weights (not shown) that are to be updated. In certain aspects, the weights may be stored in an SRAM configured for in-memory computations, as described in more detail herein. The output of each of the layers (e.g., 356, 358, 360, 362, 364) may serve as an input of a succeeding one of the layers (e.g., 356, 358, 360, 362, 364) in the deep convolutional network 350 to learn hierarchical feature representations from input data 352 (e.g., images, audio, video, sensor data and/or other input data) supplied at the first of the convolution blocks 354A. The output of the deep convolutional network 350 is a classification score 366 for the input data 352. The classification score 366 may be a set of probabilities, where each probability is the probability of the input data including a feature from a set of features.

Example Static Random-Access Memory (SRAM) for In-Memory Computing

In binary weight networks, weights and neuron activations are binarized. A convolutional neural network (CNN) with binary weights may be implemented with a smaller footprint than an equivalent network implemented with real-valued weights. Binary-weight approximations of large CNNs may be implemented with a smaller amount of memory storage, and thus, may be implemented in small portable devices while maintaining the same level of accuracy as real-valued networks. Binary network computations may be performed by enabling binary convolutions within a static random-access memory (SRAM) array. Certain aspects of the present disclosure provide circuitry and techniques for multi-bit multiply accumulate (MAC) using a charge-sharing compute-in-memory (CIM) technique. For example, certain aspects are directed to analog in-memory computing using a charge-sharing base CIM technique.

Figure 4:
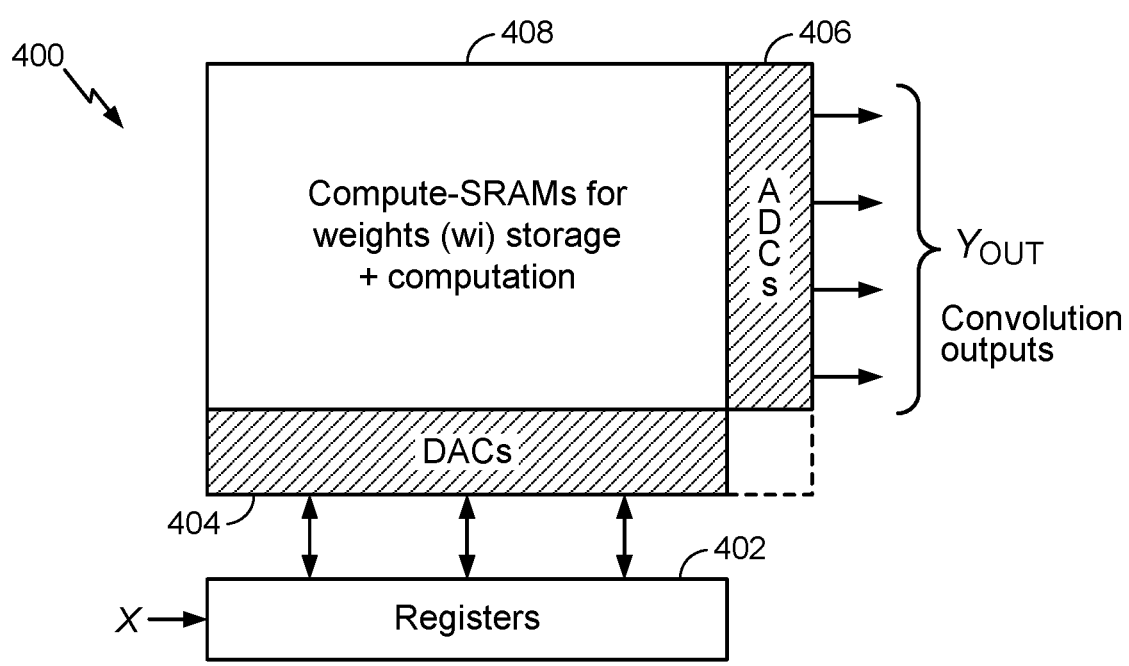
FIG. 4 illustrates an example computation system having a computation array implemented for in-memory convolution computation, in accordance with certain aspects of the present disclosure.

FIG. 4 illustrates an example computation system 400 having a computation array 408 implemented for in-memory convolution computation, in accordance with certain aspects of the present disclosure. The computation array 408 may include an array of SRAM memory cells, each coupled to computation circuitry, as described in more detail herein. Weight parameters may be stored in SRAM memory cells of the computation array 408. As illustrated, input data, labeled "X" in FIG. 4, may be input to registers 402. The input data may be provided to the computation circuitry via digital-to-analog converters (DACs) 404. The computation array 408 may perform in-memory convolution computation based on the input data and as a function of weights (wi) stored in the SRAM memory cells. The output of the computation may be input to analog-to-digital converters (ADCs) 406, which provide digital convolution outputs, labeled in FIG. 4 as "$Y_{OUT}$."

Figure 5:
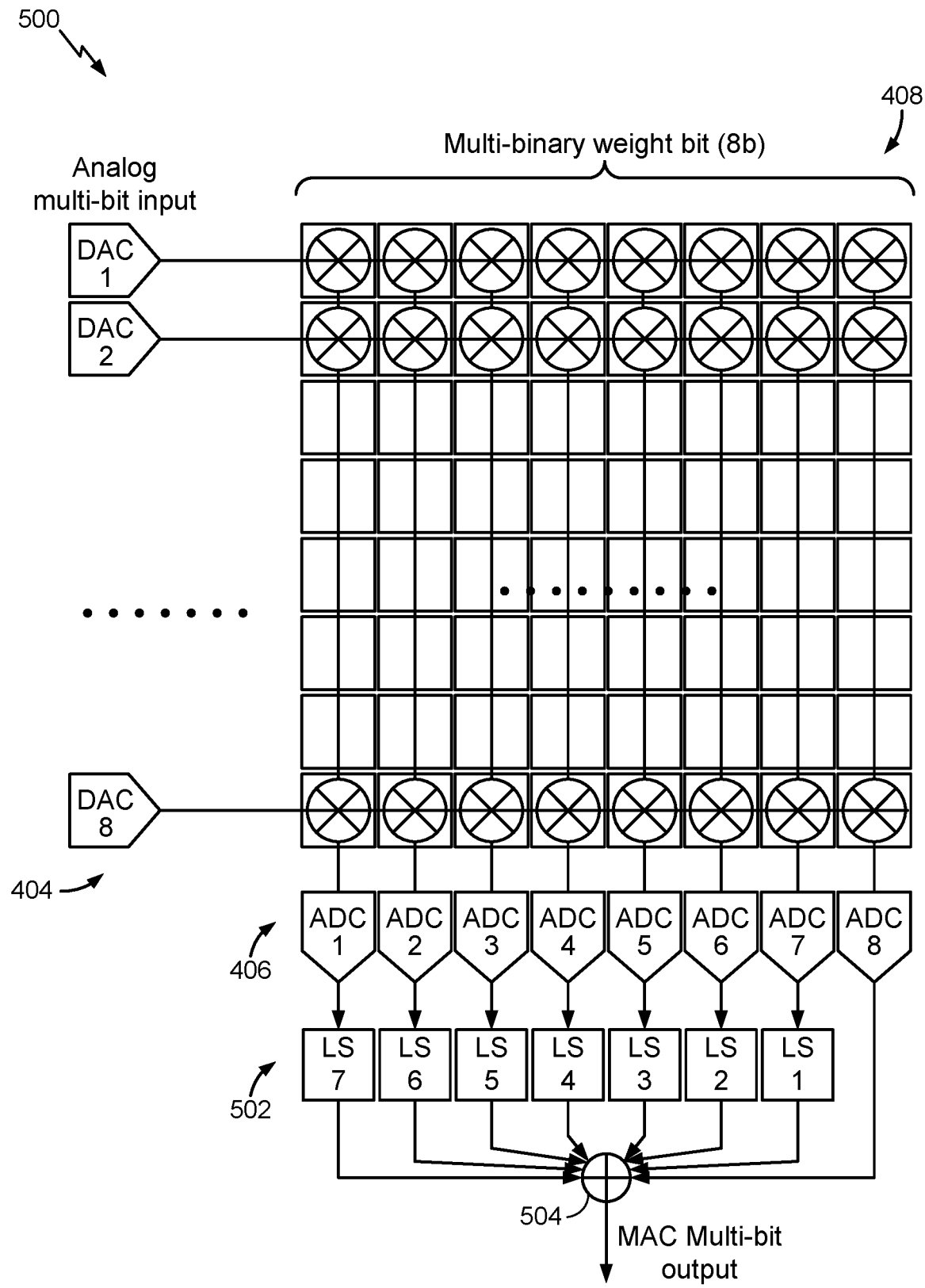
FIG. 5 illustrates an example computation system, in accordance with certain aspects of the present disclosure.

FIG. 5 illustrates an example computation system 500, in accordance with certain aspects of the present disclosure. Each of the DACs 404 may implement a multi-bit analog input for in-memory computation. For instance, each of the DACs 404 may receive a digital input signal and generate an analog signal. Moreover, each of the DACs 404 may be associated with a row of memory cells of the computation array 408 that store a multi-bit weight parameter. In other words, each memory cell in a row of the computation array 408 may store one bit of the multi-bit weight parameter, as described in more detail herein.

ADCs 406 may receive a computation output of memory cells for each column of the computation array 408. Each of the ADCs 406 generates a digital output representing the computation performed for the corresponding column of the computation array 408. Each of the ADCs 406 is associated with a bit location of the multi-bit output generated by the computation system 500. For example, ADC1 is associated with the most-significant bit (MSB) of the multi-bit output, and ADC8 is associated with the least-significant bit (LSB) of the multi-bit output. Therefore, the output of all the ADCs 406, with the exception of ADC8, may be left-shifted (e.g., via a respective one of left-shift (LS) circuits 502) depending on the bit location of the multi-bit output each ADC represents. The outputs of the LS circuits 502 are provided to a summer 504 to generate the multi-bit output. For instance, the digital output of ADC1 may be left-shifted 7 times via left-shift (LS) circuit LS7 such that the digital output of ADC1 is associated with bit 7 (e.g., the MSB) of the multi-bit output generated by the summer 504, and the digital output of ADC2 may be left-shifted 6 times via left-shift circuit LS6 such that the digital output of ADC2 is associated with bit 6 of the multi-bit output generated by the summer 504. The digital output of ADC8 is not left-shifted such that the digital output of ADC8 is associated with bit 0 (e.g., the LSB) of the multi-bit output generated by the summer 504.

FIGS. 6A-6E illustrate implementation details of an example computation system 600, in accordance with certain aspects of the present disclosure. As illustrated, the computation system 600 includes computation circuits 602, 604, 606, 608, each including a memory cell 610, 612, 614, 616, respectively. The memory cells 610, 612, 614, 616 store the weight parameters for the computation system 600. For example, memory cells 610, 614 may store a 2-bit weight parameter, and the memory cells 612, 616 may store another 2-bit weight parameter.

As illustrated, each of the memory cells 610, 612, 614, 616 may be selectively coupled to a capacitive element 618, 650, 652, 654, respectively. For example, each of the computation circuits 602, 604, 606, 608 includes a capacitive element 618, 650, 652, 654 coupled to a node 660, 672, 674, 676, respectively. Each of the computation circuits 602, 604, 606, 608 also includes a switch 620, 678, 680, 682 series-coupled between an associated read bit line (RBL) 622, 623 and the respective node 660, 672, 674, 676. Each of the computation circuits 602, 604, 606, 608 also includes a switch 624, 684, 686, 688 series-coupled between a respective activation (ACT) line 628, 629 and the respective node 660, 672, 674, 676. The switches 620, 678 are controlled via a read word line (RWL) 626, and the switches 680, 682 are controlled via a RWL 627. The switches 624, 686 are controlled via a charge word line (CWL) 634, and the switches 684, 688 are controlled via a CWL 635, as illustrated.

Each of the computation circuits 602, 604, 606, 608 includes switches for coupling the node 660, 672, 674, 676 to a reference potential node (e.g., electric ground) to discharge the capacitive elements 618, 650, 652, 654 during a discharge phase, as described in more detail herein. For example, switches 630, 632 may be used to discharge the capacitive element 618, switches 690, 692 may be used to discharge the capacitive element 650, switches 694, 696 may be used to discharge the capacitive element 652, and switches 698, 699 may be used to discharge the capacitive element 654. For instance, the capacitive element 618 is only discharged during the discharge phase if both switches 630, 632 are turned on (e.g., closed). As illustrated, the switches 630, 690 are controlled via a discharge word line (DCWL) 631, and the switches 694, 698 are controlled via a DCWL 691. Each of the switches 632, 692, 696, 699 is controlled by the output of a respective one of the memory cells 610, 612, 614, 616. Each of the ACT lines 628, 629 is controlled via a respective DAC 640, 641, and each of the RBLs 622, 623 is coupled to an input of a respective ADC 642, 643. The output of the ADC 642 may be coupled to a LS circuit 644. The output of the LS circuit 644 and the output of the ADC 643 are coupled to inputs of the summer 504, as illustrated.

Figure 6A:
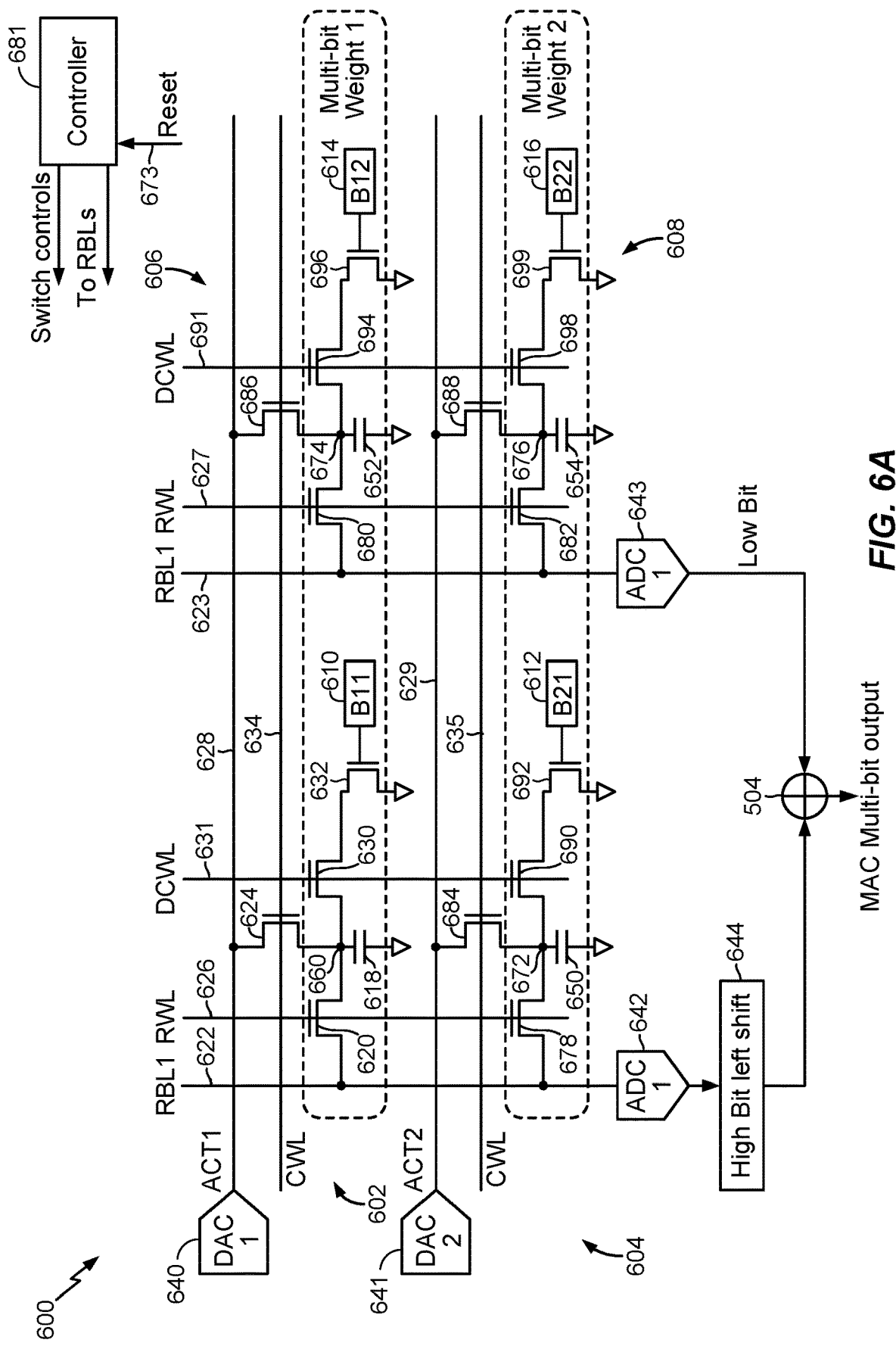
FIGS. 6A-6E illustrate implementation details of an example computation system, in accordance with certain aspects of the present disclosure.

The operation of the computation system 600 is described in more detail with respect to FIGS. 6B-6E. The graph 693 of FIGS. 6B-6E illustrates the signals at CWL 634, ACT line 628, DCWL 631, RWL 626, RBL 622, output of ADC 642, and a reset line 673. The reset line 673 may be used to provide a reset signal to a controller 681, as illustrated in FIG. 6A, for setting the signal at the RBLs 622, 623 to a reference potential (e.g., electric ground) to facilitate discharging of the capacitive elements 618, 650, 652, 654 during a reset phase, as described in more detail herein. The controller 681 may also control the switches of the computation system 600, in accordance with the operations described herein.

Figure 6B:
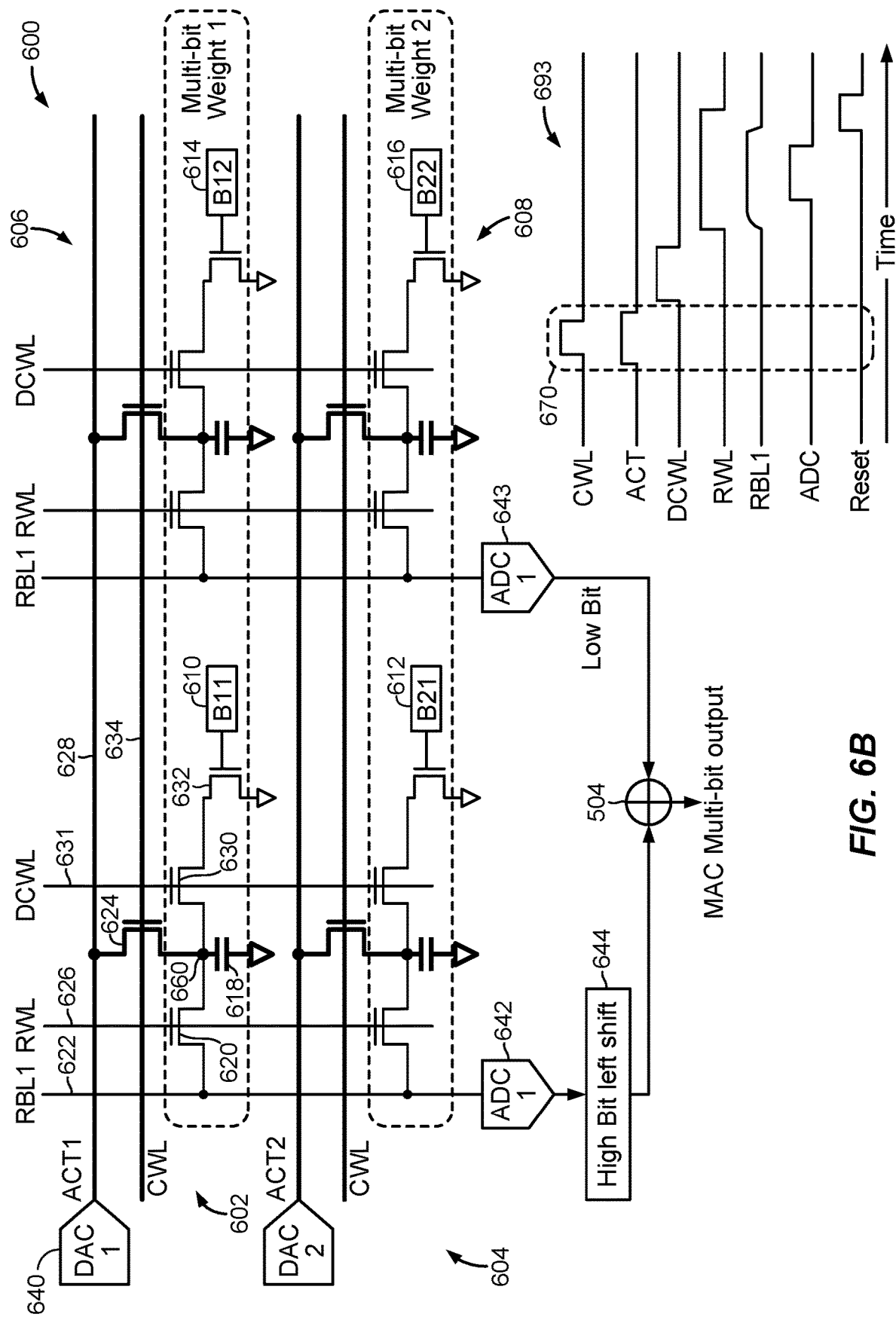

As illustrated in FIG. 6B, during an activation phase 670 (also referred to as a charge cycle), each of the DACs 640, 641 may generate an analog signal on a respective ACT line 628, 629 based on a digital input signal provided to the DAC to charge the capacitive elements of the memory cells. For example, the switch 624 may be turned on via the signal on CWL 634, coupling the capacitive element 618 to the ACT line 628 such that the capacitive element 618 is charged to the voltage on the ACT line 628. In other words, during the activation phase 670, an analog signal representing a multi-bit digital input may be generated at each of the ACT lines 628, 629. The analog signal on the ACT lines 628, 629 may be stored in a respective one of the capacitive elements 618, 650, 652, 654 by closing the switches 624, 684, 686, 688.

Figure 6C:
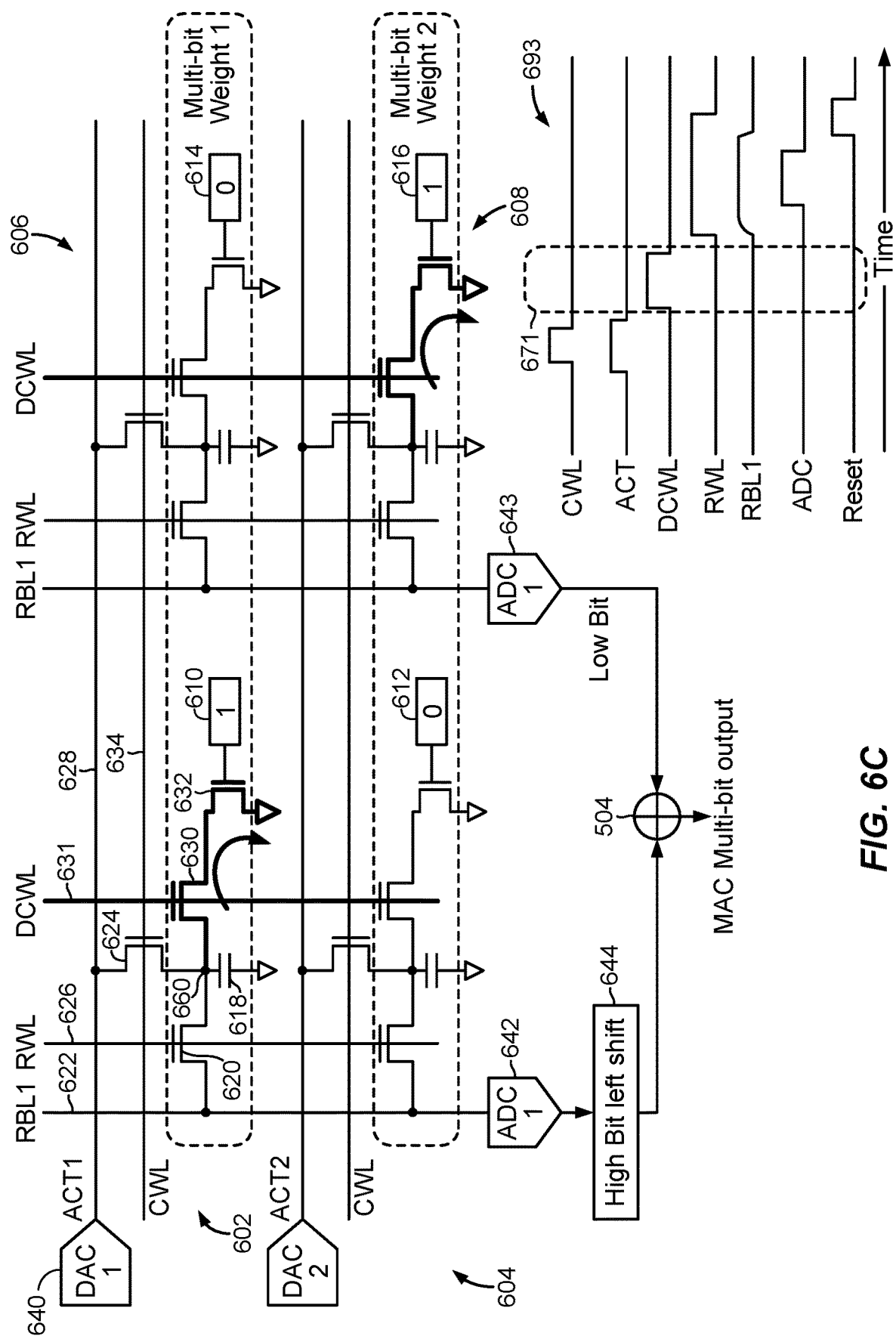

As illustrated in FIG. 6C, during a computation phase 671, a dot-product of the analog signal stored in the capacitive elements and the multi-bit binary weight stored in the memory cells may be performed. For example, the signal at the DCWLs 631, 691 may transition to logic high, turning on switches 630, 690, 694, 698. The switches 632, 692, 696, 699 are also turned on depending on a value of a bit stored in a respective one of the memory cells 610, 612, 614, 616. For example, if the weight stored in the memory cell 610 is logic high, the switch 632 is turned on, discharging the capacitive element 618, and if the weight stored in the memory cell 610 is logic low, the switch 632 is turned off (e.g., opened) such that the capacitive element 618 maintains its previously stored charge representing the multi-bit digital input, in effect performing a dot-product computation.

Figure 6D:
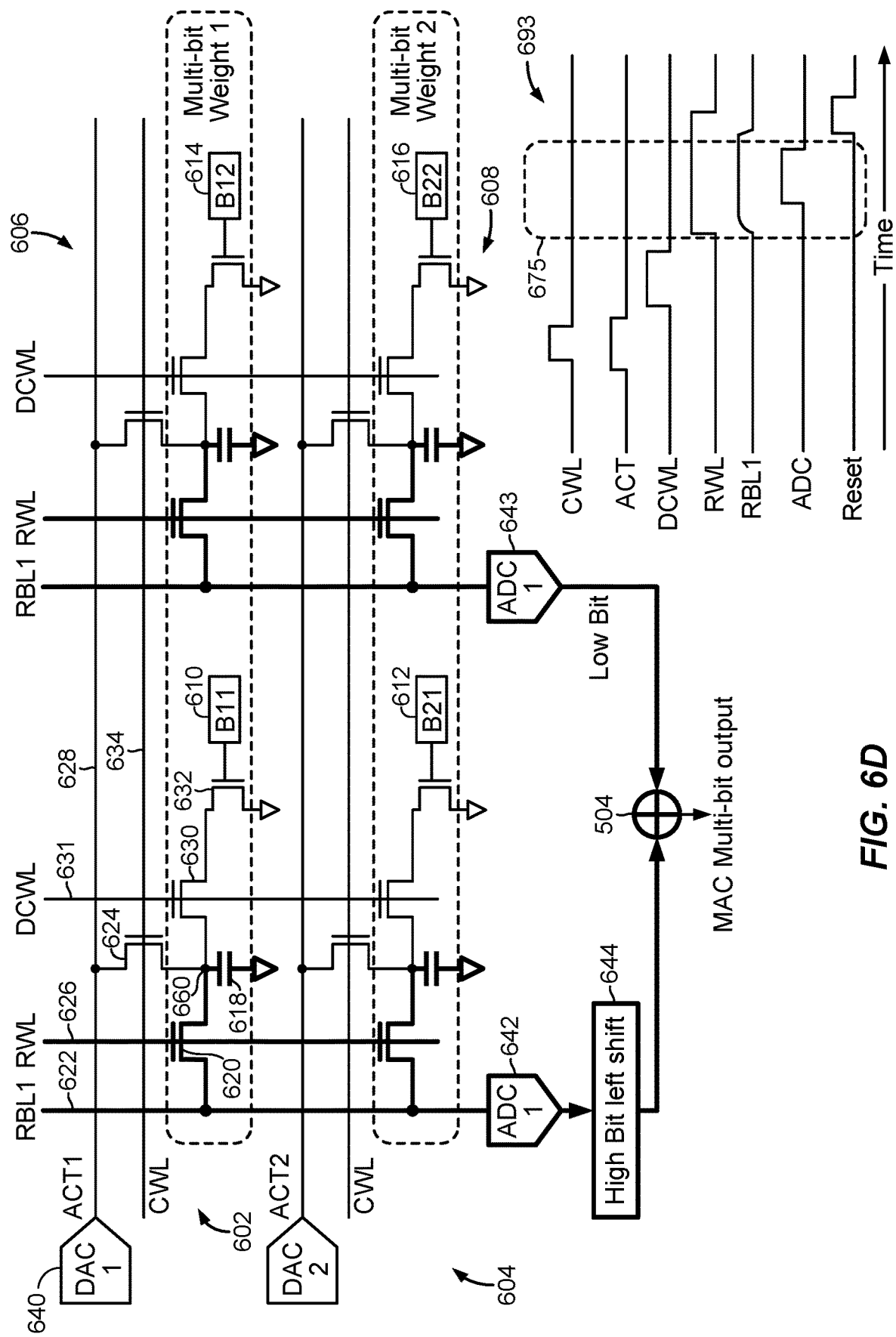

As illustrated in FIG. 6D, during an accumulation phase 675 (also referred to as a read cycle), the charge on the RBLs 622, 623 may be read and accumulated. The RWLs 626, 627 may be enabled (e.g., set to logic high) to start charge-sharing of memory cells. For example, the signal at RWL 626 may transition to logic high, turning on switches 620, 678 such that both the capacitive elements 618, 650 are coupled to the RBL 622. Thus, the total charge across the capacitive elements 618, 650 during the accumulation phase 675 may be equal to the sum of the charge across each of the capacitive elements 618, 650. Each of the ADCs 642, 643 then converts the analog voltage on a respective RBL 622, 623 to a digital signal. The digital output of the high-bit ADC 642 is left-shifted via the LS circuit 644, and the digital output of the low-bit ADC 643 is provided to the summer 504 to generate the multi-bit output, as described herein.

Figure 6E:
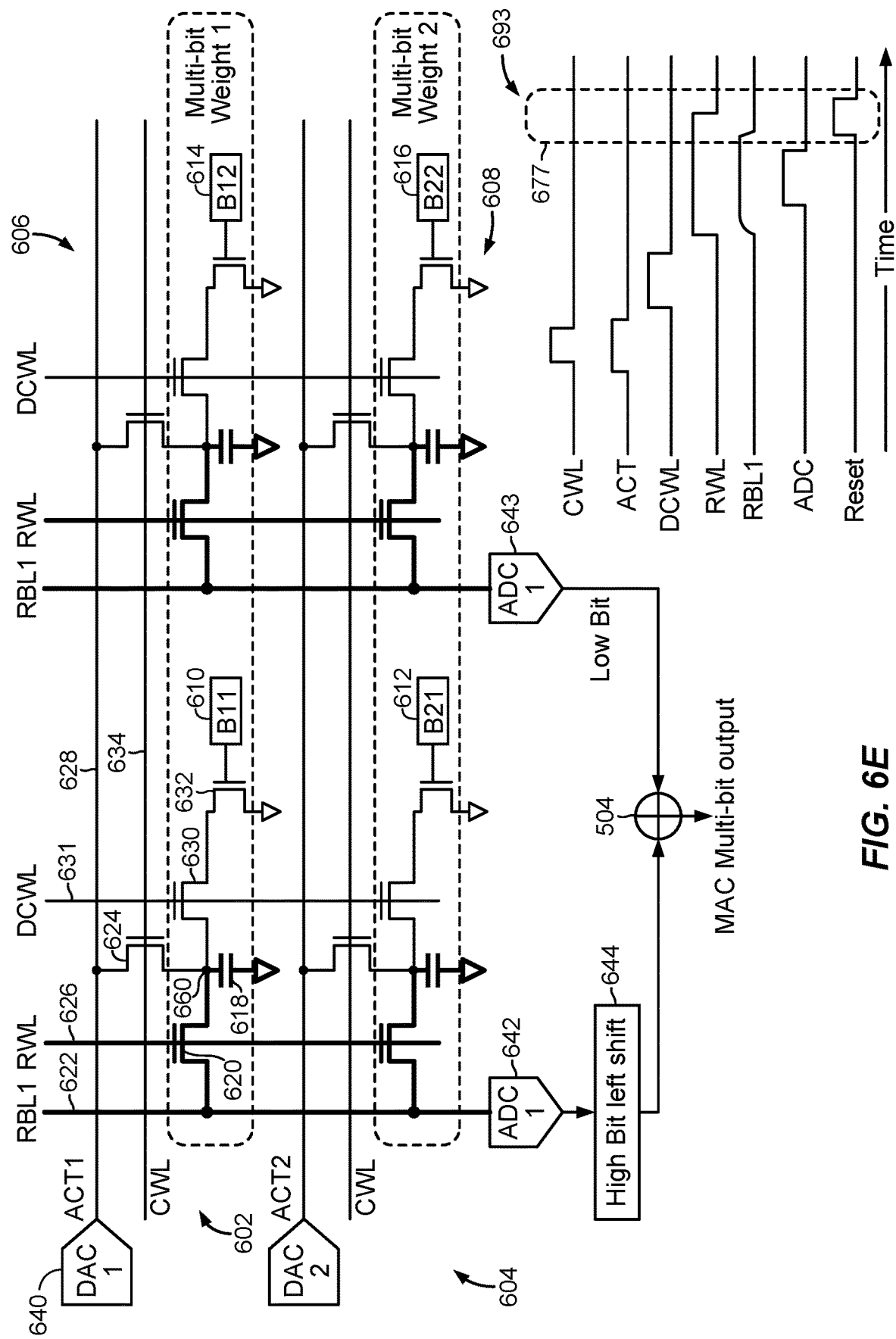

As illustrated in FIG. 6E, during a reset phase 677, the reset signal transitions to logic high, such that the controller 681 discharges (e.g., sets to logic low) the RBLs 622, 623. The RWLs 626, 627 are then enabled (e.g., set to logic high) during the reset phase 677 such that the RBLs 622, 623 are coupled to associated capacitive elements 618, 650, 652, 654, discharging the capacitive elements. In other words, the analog voltages stored in the capacitive elements are discharged (reset), allowing for another computation to be performed.

Figure 7:
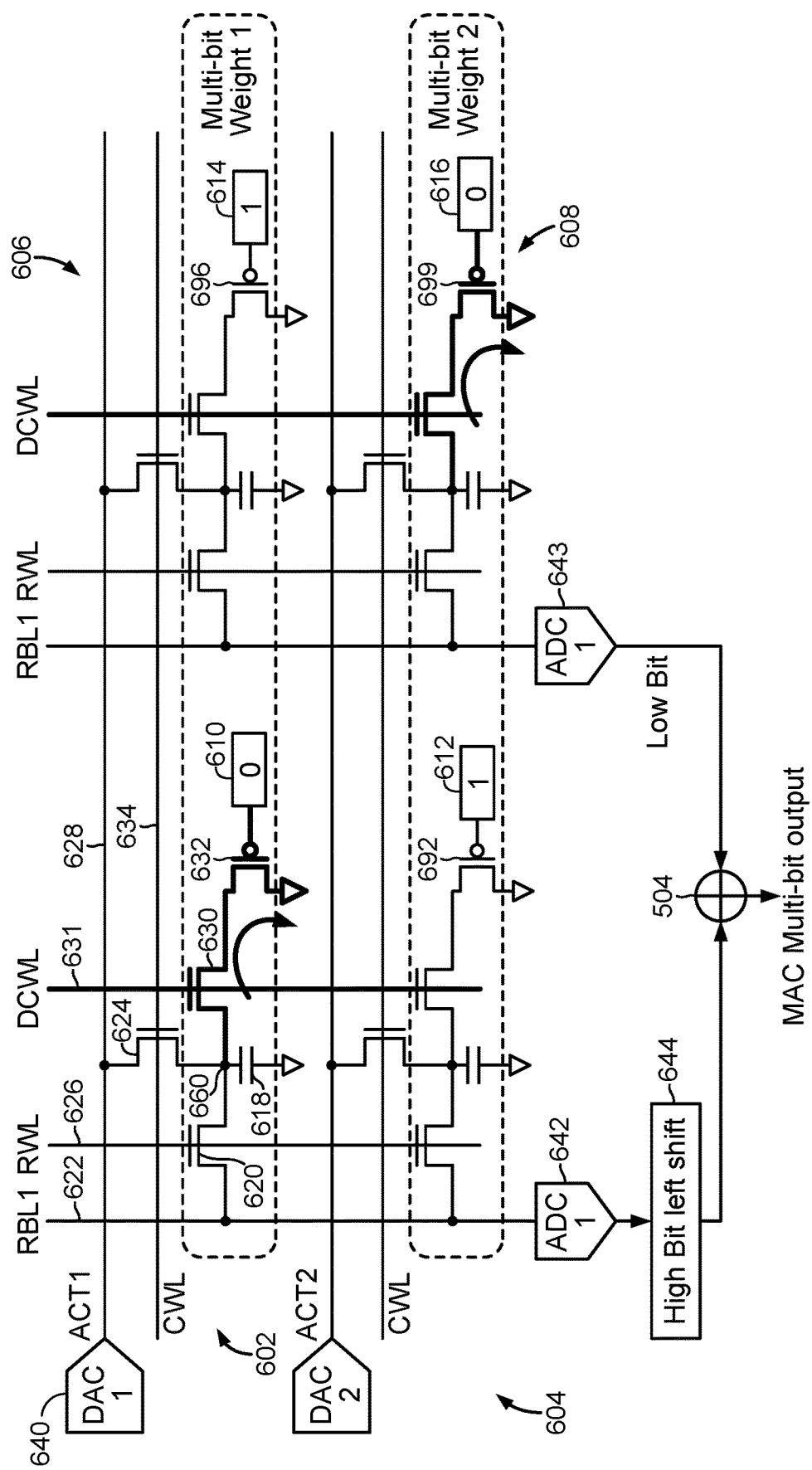
FIG. 7 illustrates an example computation system having memory cells configured to control a p-type metal-oxide-semiconductor (PMOS) transistor during a computation phase, in accordance with certain aspects of the present disclosure.

FIG. 7 illustrates an example computation system 700 having memory cells configured to control a p-type metal-oxide-semiconductor (PMOS) transistor during a computation phase, in accordance with certain aspects of the present disclosure. In other words, the switches 632, 692, 696, 699 are implemented using PMOS transistors, as opposed to the computation system 600 of FIG. 6 where the switches 632, 692, 696, 699 are implemented as n-type metal-oxide-semiconductor (NMOS) transistors. Thus, during the computation phase 671, the capacitive elements 618, 650, 652, 654 are discharged when the output of a respective one of the memory cells 610, 612, 614, 616 is logic low.

Figure 8:
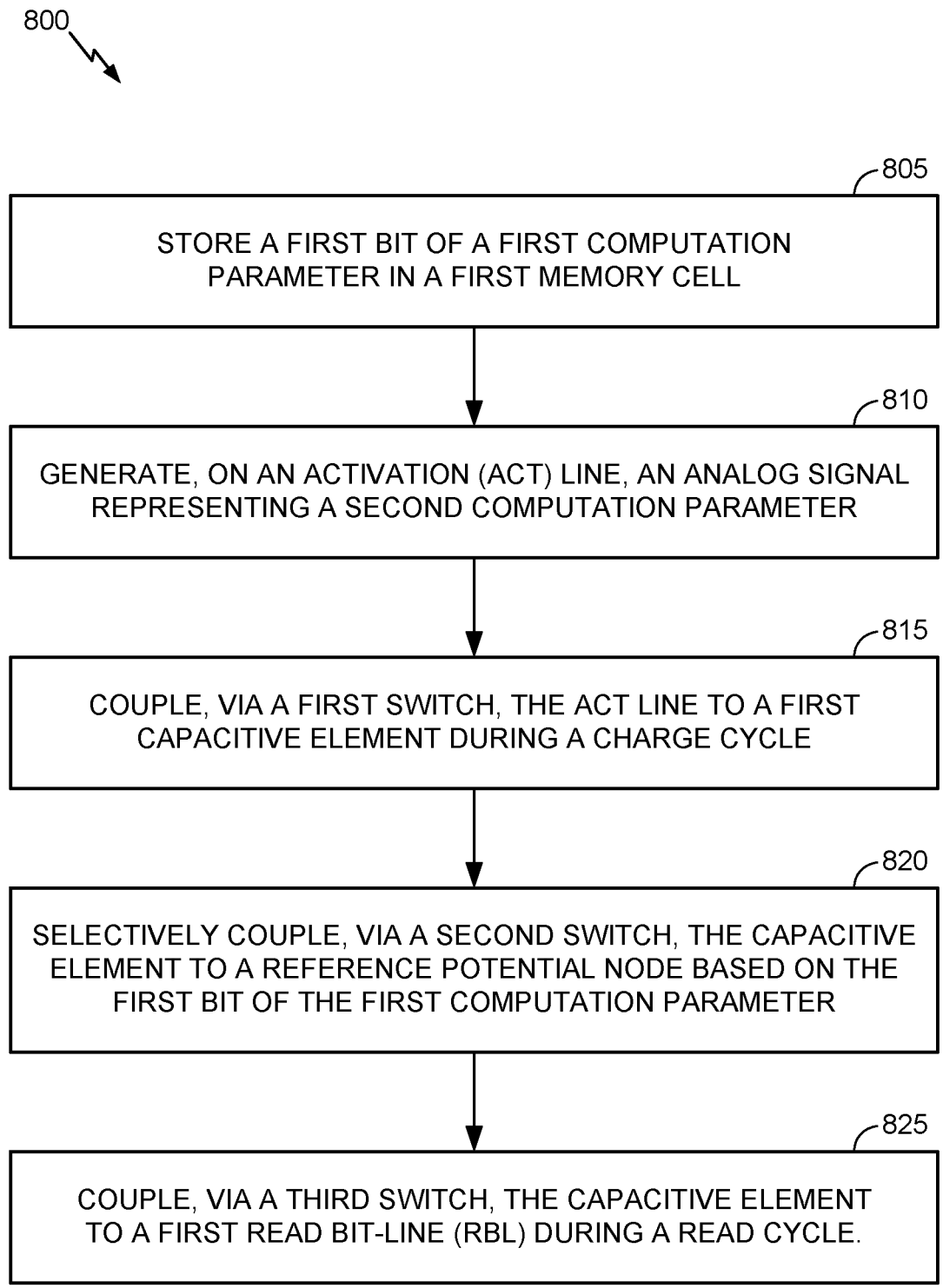
FIG. 8 is a flow diagram illustrating example operations for in-memory computation, in accordance with certain aspects of the present disclosure.

FIG. 8 is a flow diagram illustrating example operations 800 for in-memory computation, in accordance with certain aspects of the present disclosure. The operations 800 may be performed by the computation system 500, 600, or 700.

The operations 800 begin, at block 805, with the computation system storing a first bit of a first computation parameter in a first memory cell (e.g., memory cell 610), and at block 810, generating, on an ACT line (e.g., ACT line 628), an analog signal representing a second computation parameter. At block 815, the computation system couples, via a first switch (e.g., switch 624), the ACT line to a first capacitive element (e.g., capacitive element 618) during a charge cycle, and at block 820, selectively couples, via a second switch (e.g., switch 632), the capacitive element to a reference potential node based on the first bit of the first computation parameter. At block 825, the computation system couples, via a third switch (e.g., switch 620), the capacitive element to a first RBL (e.g., RBL 622) during a read cycle.

In certain aspects, generating the analog signal may include converting (e.g., via DAC 640) a digital signal representing the second computation parameter to the analog signal. In certain aspects, the computation system may also include converting (e.g., via ADC 642) an analog signal on the RBL to a digital signal during the read cycle.

In certain aspects, the computation system may store a second bit of the first computation parameter in a second memory cell (e.g., memory cell 614). In this case, the computation system may also couple, via a fourth switch (e.g., switch 686), the ACT line to a second capacitive element (e.g., capacitive element 652) during the charge cycle. The computation system may then selectively couple, via a fifth switch (e.g., switch 696), the second capacitive element to the reference potential node based on the second bit of the first computation parameter, and couple, via a sixth switch (e.g., switch 680), the capacitive element to a second RBL (e.g., 623) during the read cycle.

In certain aspects, the computation system may convert (e.g., via ADC 642) an analog signal on the first RBL to a first digital signal, convert (e.g., via ADC 643) an analog signal on the second RBL to a second digital signal, and combine (e.g., via summer 504) the first digital signal and the second digital signal to generate a computation output signal. In some cases, the computation system may left-shift (e.g., via left-shift circuit 644) bits of the first digital signal. In this case, the combining of the first and second digital signals may include combining the left-shifted first digital signal and the second digital signal. In some cases, the computation system may also discharge the first capacitive elements during a reset cycle prior to the charge cycle.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A circuit for in-memory computation, comprising:
a first memory cell; and
a first computation circuit comprising:
 a first switch having a control input coupled to an output of the first memory cell;
 a second switch coupled between a node of the first computation circuit and the first switch, a control input of the second switch being coupled to a discharge word-line (DCWL);
 a capacitive element coupled between the node and a reference potential node;
 a third switch coupled between the node and a read bit-line (RBL); and
 a fourth switch coupled between the node and an activation (ACT) line.

2. The circuit of claim 1, further comprising:
a digital-to-analog converter (DAC) having an output coupled to the ACT line; and
an analog-to-digital converter (ADC) having an input coupled to the RBL.

3. The circuit of claim 1, further comprising:
a second memory cell; and
a second computation circuit comprising:
 a first switch having a control input coupled to an output of the second memory cell;

a second switch coupled between a node of the second computation circuit and the first switch of the second computation circuit, a control input of the second switch of the second computation circuit being coupled to another DCWL;

a capacitive element coupled between the node of the second computation circuit and the reference potential node;

a third switch coupled between the node of the second computation circuit and another RBL; and a fourth switch coupled between the node of the second computation circuit and the ACT line.

4. The circuit of claim 3, further comprising:
a digital-to-analog converter (DAC) having an output coupled to the ACT line;
a first analog-to-digital converter (ADC) having an input coupled to the RBL; and
a second analog-to-digital converter (ADC) having an input coupled to the other RBL.

5. The circuit of claim 4, wherein the DAC is configured to generate, on the ACT line, an analog signal representing a first computation parameter, and wherein the first memory cell and the second memory cell are configured to store different bits of a second computation parameter.

6. The circuit of claim 4, further comprising:
a left-shift circuit having an input coupled to an output of the first ADC; and
a summer having inputs coupled to an output of the left-shift circuit and an output of the second ADC.

7. The circuit of claim 3, further comprising:
a third memory cell; and
a third computation circuit comprising:
a first switch having a control input coupled to an output of the third memory cell;
a second switch coupled between a node of the third computation circuit and the first switch of the third computation circuit, a control input of the second switch of the third computation circuit being coupled to the DCWL;
a capacitive element coupled between the node of the third computation circuit and the reference potential node;
a third switch coupled between the node of the third computation circuit and the RBL; and
a fourth switch coupled between the node of the third computation circuit and another ACT line.

8. The circuit of claim 3, further comprising a controller configured to:
store a first bit of a first computation parameter in the first memory cell;
generate, on the ACT line, an analog signal representing a second computation parameter;
couple, via the fourth switch of the first computation circuit, the ACT line to the capacitive element of the first computation circuit during a charge cycle;
selectively couple, via the first switch and the second switch of the first computation circuit, the capacitive element of the first computation circuit to the reference potential node based on the first bit of the first computation parameter; and
couple, via the third switch of the first computation circuit, the capacitive element of the first computation circuit to the RBL during a read cycle.

9. The circuit of claim 8, wherein the controller is further configured to:
store a second bit of the first computation parameter in the second memory cell;

couple, via the fourth switch of the first computation circuit, the ACT line to the capacitive element of the second computation circuit during the charge cycle;
selectively couple, via the first switch and the second switch of the second computation circuit, the capacitive element of the second computation circuit to the reference potential node based on the second bit of the first computation parameter; and
couple, via the third switch of the second computation circuit, the capacitive element of the second computation circuit to the other RBL during the read cycle.

10. The circuit of claim 1, wherein at least one of the first switch, the second switch, the third switch, or the fourth switch comprises an n-type metal-oxide-semiconductor (NMOS) transistor.

11. The circuit of claim 1, wherein at least one of the first switch, the second switch, the third switch, or the fourth switch comprises a p-type metal-oxide-semiconductor (PMOS) transistor.

12. The circuit of claim 1, wherein the first memory cell comprises a static random-access memory (SRAM) memory cell.

13. A method for in-memory computation, comprising:
storing a first bit of a first computation parameter in a first memory cell;
generating, on an activation (ACT) line, an analog signal representing a second computation parameter;
coupling, via a first switch, the ACT line to a first capacitive element during a charge cycle;
selectively coupling, via a second switch, the first capacitive element to a reference potential node based on the first bit of the first computation parameter; and
coupling, via a third switch, the first capacitive element to a first read bit-line (RBL) during a read cycle.

14. The method of claim 13, wherein generating the analog signal comprises converting a digital signal representing the second computation parameter to the analog signal.

15. The method of claim 13, further comprising converting an analog signal on the first RBL to a digital signal during the read cycle.

16. The method of claim 13, further comprising:
storing a second bit of the first computation parameter in a second memory cell;
coupling, via a fourth switch, the ACT line to a second capacitive element during the charge cycle;
selectively coupling, via a fifth switch, the second capacitive element to the reference potential node based on the second bit of the first computation parameter; and
coupling, via a sixth switch, the second capacitive element to a second RBL during the read cycle.

17. The method of claim 16, further comprising:
converting an analog signal on the first RBL to a first digital signal;
converting an analog signal on the second RBL to a second digital signal; and
combining the first digital signal and the second digital signal to generate a computation output signal.

18. The method of claim 17, further comprising left-shifting bits of the first digital signal, wherein the combining of the first and second digital signals comprises combining the left-shifted bits of the first digital signal and the second digital signal.

19. The method of claim 13, further comprising discharging the first capacitive element during a reset cycle prior to the charge cycle.

20. The method of claim 13, wherein the first memory cell comprises a static random-access memory (SRAM) memory cell.

\* \* \* \* \*